US010747433B2

(12) United States Patent
Li et al.

(10) Patent No.: US 10,747,433 B2
(45) Date of Patent: Aug. 18, 2020

(54) COMPUTER ARCHITECTURE FOR HIGH-SPEED, GRAPH-TRAVERSAL (71) Applicant: Wisconsin Alumni Research Foundation, Madison, WI (US)

(72) Inventors: Jing Li, Madison, WI (US); Jialiang Zhang, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 278 days.

(21) Appl. No.: 15/901,376

(22) Filed: Feb. 21, 2018

(65) Prior Publication Data
US 2019/0258401 A1 Aug. 22, 2019

(51) Int. Cl.
G06F 16/00 (2019.01)
G06F 3/06 (2006.01)
G06F 16/901 (2019.01)
H03M 7/40 (2006.01)
H03M 7/30 (2006.01)

(52) U.S. Cl.
CPC ............ G06F 3/0604 (2013.01); G06F 3/068 (2013.01); G06F 3/0655 (2013.01); G06F 16/9024 (2019.01); H03M 7/40 (2013.01); H03M 7/6005 (2013.01)

(58) Field of Classification Search
None
See application file for complete search history.

(56) References Cited

U.S. PATENT DOCUMENTS

| 8,484,607 | B1 * | 7/2013 | Tang ................. G03F 7/70466 716/136 |
| 9,922,376 | B1 * | 3/2018 | Wang ................. G06Q 40/123 |
| 10,432,639 | B1 * | 10/2019 | Bebee ..................... G06T 1/20 |
| 2008/0218518 | A1 * | 9/2008 | Zhou ..................... G06F 17/11 345/440 |
| 2011/0080947 | A1 * | 4/2011 | Chen ................... H04N 19/13 375/240.12 |
| 2016/0378791 | A1 * | 12/2016 | Daga ................ G06F 16/24569 707/769 |
| 2018/0137155 | A1 * | 5/2018 | Majumdar .......... G06F 16/2228 |

FOREIGN PATENT DOCUMENTS

WO 2011032077 A2 3/2011

OTHER PUBLICATIONS

Naumov et al., "Parallel Depth-First Search for Directed Acyclic Graphs", 2017, all pages.*

(Continued)

Primary Examiner — Son T Hoang
(74) Attorney, Agent, or Firm — Boyle Fredrickson, S.C.

(57) ABSTRACT

A computer architecture for graph-traversal provides a processor for bottom-up sequencing through the graph data according to vertex degree. This ordered sequencing reduces redundant edge checks. In one embodiment, vertex adjacency data describing the graph may be allocated among different memory structures in the memory hierarchy to provide faster access to vertex data associated with vertices of higher degree reducing data access time. The adjacency data also may be coded to provide higher compression in memory of vertex data having high vertex degree.

20 Claims, 5 Drawing Sheets (56) References Cited

OTHER PUBLICATIONS

Hiragushi et al. ("Efficient Hybrid Breath-First Search on GPUs"), all pages. (Year: 2013).*
Beamer et al.; "Direction-Optimizing Breadth-First Search"; Scientific Programming 21, No. 3-4 (2013): 1 pp. 137-148. US.
Beamer et al.; "Distributed memory breadth-first search revisited: Enabling bottom-up search." In 2013 IEEE International Symposium on Parallel & Distributed Processing, Workshops and Phd Forum, pp. 1618-1627. IEEE, 2013. US.
International Search Report of International Application No. PCT/US2019/017227 dated May 27, 2019.
Beamer et al.; "Direction-Optimizing Breadth-First Search"; Scientific Programming 21, No. 3-4 (2013): pp. 137-148. US.

\* cited by examiner

FIG. 7 ional processing system."
COMPUTER ARCHITECTURE FOR HIGH-SPEED, GRAPH-TRAVERSAL

STATEMENT REGARDING FEDERALLY SPONSORED RESEARCH OR DEVELOPMENT

--

CROSS REFERENCE TO RELATED APPLICATION

--

BACKGROUND OF THE INVENTION

The present invention relates generally to computer architectures, and in particular to an architecture providing improved speed in traversing graph data.

A graph is a data structure describing a set of vertices (nodes) interconnected by edges to form a network. Graphs provide a useful model of many real-world structures, for example, relationships between webpages (where the vertices describe webpages and the edges describe links between webpages) or individuals in a social network (where the vertices describe individuals and the edges describe their friends or interests). Graphs are also used in the fields of neural networks and bioinformatics.

Computers are often called upon to process graph data by means of a "graph-traversal" operation where each vertex of the graph is visited and data is collected, for example, to produce a minimum spanning tree, or otherwise characterize the graph or the relationships of the vertices.

The vertices of a graph can be characterized according to "degree" indicating how many edges connect to that vertex. "Scale-free graphs" are a class of graphs where the distribution of vertex degrees follows a power-law distribution. Typically, such scale-free graphs have a small number of vertices with a large number of connections and many more vertices (a long-tale) with very few connections. During a graph-traversal, such scale-free graphs produce large numbers of redundant edge checks (investigating vertices that have already been visited). These edge checks require inefficient, irregular access to the memory holding the graph data.

Improved efficiency in graph-traversal can been accomplished through the use of a hybrid traversal strategy employing a "top-down" traversal followed by a "bottom-up" traversal. In an example top-down traversal (in this case a breadth-first search), a conventional CPU or GPU-based system executes the program to review the graph data outward from a starting vertex to find its neighbors (edges leading to other vertices) which establish a frontier. The vertices in this frontier are marked as visited and then edges from these vertices investigated in turn to establish a new frontier. When after multiple iterations the frontier has reached a critical size, the search strategy shifts to a "bottom-up" traversal. In this mode, the computer looks at the remaining un-visited vertices to check to see if they have a connection to the existing frontier. If so, that vertex is marked as visited and added to the frontier and the strategy immediately stops searching the other edges of that vertex, greatly saving processing time.

The top-down and bottom-up search strategies can be both executed using parallel processors; however, the "top-down" traversal requires an atomic updating of the frontier. This atomic updating is not required for the bottom-up strategy which investigates each vertex separately.

A description of this hybrid search strategy is found, for example, in Scott Beamer, Aydin Buluc, Krste Asanovic, and David Patterson, 2013, distributed memory breadth-first search revisited: Enabling Bottom-Up Search, in Parallel and Distributed Processing Symposium Workshops & PhD Forum (IPDPSW), 2013 IEEE 27th International, IEEE, 1618-1627 (the Beamer reference) hereby incorporated by reference.

Graph data structures can quickly become large making graph-traversal slow even with such hybrid search strategies. Currently, the social networking site of Facebook is described by a graph with over 1 billion vertices and more than 1 trillion edges.

SUMMARY OF THE INVENTION

The present invention provides an improved computer architecture that exploits an awareness of vertex degree in implementing the graph-traversal. First, during the bottom-up portion of the traversal, the architecture sequences through the vertex data according to vertex degree. As will be discussed in the application, the inventors have determined that this sequencing can greatly reduce unproductive edge checks. Second, during access to the vertex data, access time is reduced by loading the data with greatest access frequency in the fastest memory of the memory hierarchy. In this regard, the inventors have determined that high index vertices data is accessed more frequently. Third, when the data is compressed to allow greater data storage in fast memory, storage footprint is reduced by associating the vertex data for high-degree vertices with shorter codewords improving the representation of this data in the smaller, faster memory structures.

Specifically, in one embodiment, the present invention provides computer architecture for graph-traversal having a memory holding an adjacency list describing vertices of the graph and their connections through edges to other vertices and a processor communicating with the memory system and operating in a bottom-up mode traversing from unvisited vertices toward a frontier of visited vertices by examining unvisited vertices to find connections to a vertex of the frontier using the adjacency list and moving to a next vertex when a connection to a vertex of the frontier is found. The architecture operates to explore the unexamined vertices in the bottom-up direction in order of vertices degree being the number of edges connecting to the vertex.

It is thus a feature of at least one embodiment of the invention to increase the rate of graph-traversal by ordering the traversal by vertex degree in a bottom-up search. Projections based on experimentation suggests graph-traversal speeds of 45.8 billion edges per second can be obtained with this architecture.

The adjacency list may be arranged in memory by vertices degree.

It is thus a feature of at least one embodiment of the invention to simplify traversal by vertex degree by pre-sorting the adjacency list before graph-traversal. This pre-sorting can be accomplished in stream fashion at high speed.

The memory may provide a memory hierarchy beginning with smaller, high-access speeds and progressing to larger, low-access speed memory circuits, and the adjacency list may be organized to place the vertices of the adjacency list so that higher vertices degrees are toward the beginning of the memory hierarchy relative to vertices of the adjacency list having lower vertices degree.

It is thus a feature of at least one embodiment of the invention to exploit the inventor's empirical determination that vertices of higher degree have more frequent memory access, by allocating information of those high-degree vertices in memory structures having lower access latency.

The memory hierarchy may include on-chip memory on the same integrated circuit as processors and off-chip hybrid memory cube memory.

It is thus a feature of at least one embodiment of the invention to greatly increase the ability to store frequently accessed graph data on-chip memory in graph-traversal.

The computer architecture may further include a decompressor circuit positioned between the processor and the memory decompressing the adjacency list according to a codebook translating codewords representing the adjacency list in memory into adjacency data, and wherein the smaller codewords are associated with adjacency data associated with vertices of higher vertices degree.

It is thus a feature of at least one embodiment of the invention to provide greater compression to frequently accessed vertex information allowing that information greater representation in the fastest memory structures.

The memory decompressor may employ a decompression approach called Exp-Golomb coding.

It is thus a feature of at least one embodiment of the invention to employ an encoding system that minimizes additional storage requirements for the decoder.

The computer architecture may further operate in a top-down mode from the frontier to unvisited vertices by examining the frontier vertices and edges of the frontier vertices to find connections to unvisited vertices using the adjacency list and may include a mode switch switching the processor system between the first mode and the second mode according to parameters based on the progress of the traversal through the graph.

It is thus a feature of at least one embodiment of the invention to provide the benefits of hybrid graph-traversal (both top-down and bottom-up graph-traversal) for improved performance.

The computer architecture may include counters updated by the processor during the traversal of the graph and wherein the mode switch reads the counters to switch the processor system between the first and second mode based on counter values.

It is thus a feature of at least one embodiment of the invention to provide runtime optimization of top-down or bottom-up processing according to dynamically acquired data.

The counters may indicate the size of the frontier.

It is thus a feature of at least one embodiment of the invention to measure quality of the traversal indicating likely efficiencies in the top-down or bottom-up modes.

The processor provides a separate processing circuitry for the first and second modes.

It is thus a feature of at least one embodiment of the invention to provide optimized processors for top-down and bottom-up operation.

The separate processing circuitry may employ multiple parallel processors providing atomic writing to memory for the first processor but not for the second processor.

It is thus a feature of at least one embodiment of the invention to permit parallel processing of the graph-traversal problem.

The separate processing circuitry may have independent pipelines.

It is thus a feature of at least one embodiment of the invention to permit optimization of the pipelines for top-down and bottom-up processing.

The processor may be FPGA.

It is thus a feature of at least one embodiment of the invention to permit effective implementation of a special-purpose processor.

The adjacency list may be arranged in memory by vertices degree.

It is thus a feature of at least one embodiment of the invention to presort the adjacency list for higher-speed processing.

The computer architecture may include a sorting processor executing a stored program and receiving an unsorted adjacency list describing vertices of the graph and their connections through edges to other vertices and sorting that list according to vertices degree.

It is thus a feature of at least one embodiment of the invention to provide off-line sorting to simplify the architecture.

The sorting processor may generate a mapping table indicating a mapping from vertices indices identifying vertices of the unsorted adjacency list to vertices indices of the vertices list.

It is thus a feature of at least one embodiment of the invention to easily translate the traversal information to the original graph.

These particular objects and advantages may apply to only some embodiments falling within the claims and thus do not define the scope of the invention.

DETAILED DESCRIPTION OF THE PREFERRED EMBODIMENT

Hardware Overview

Figure 1:
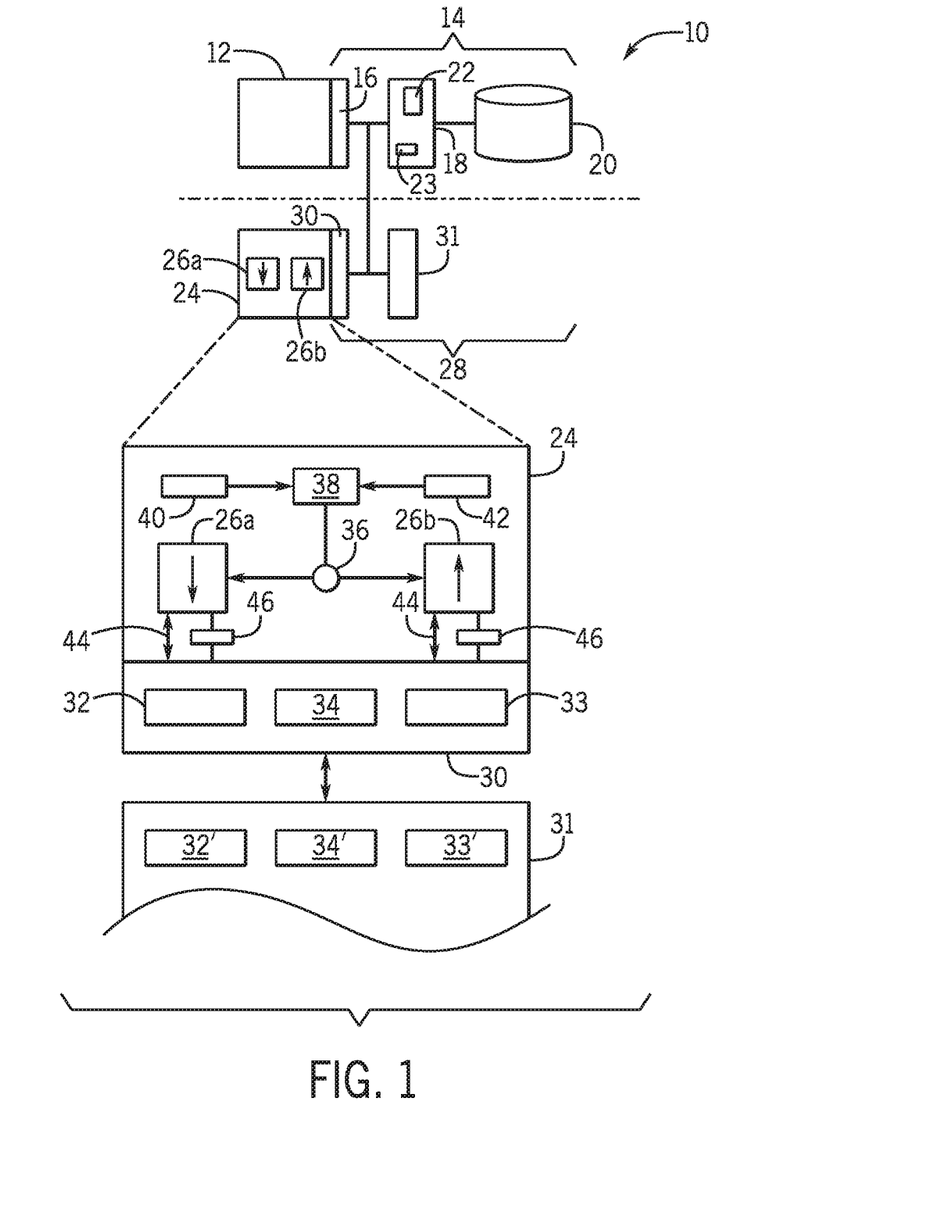
FIG. 1 is a block diagram of the architecture of the present invention showing a general-purpose CPU or GPU communicating with a graph-traversal processor, the latter having a dedicated top-down and bottom-up processor communicating with a memory hierarchy including on-chip memory, a hybrid memory cube memory and other mass storage memory or the like, FIG. 1 further showing an expanded view of a switching mechanism for switching the top-down and bottom-up processor.

Referring now to FIG. 1, a computer system 10 may provide for a general-purpose processor 12, for example, a von Neuman type architecture executing a general instruction set possibly using out of order and speculative execution or a so-called graphic processor unit (GPU) providing multiple parallel operating cores. The general-purpose processor 12 may communicate with a hierarchical memory 14 including, for example, on-chip cache memory 16, external memory 18, for example, SRAM and DRAM and/or so-called flash memory, and disk storage 20. The general-purpose processor 12 may execute a program 22 stored in the memory 14 whose operation will be described below.

The general-purpose processor 12 may communicate, for example, to a shared data bus with special-purpose, graph-traversal processor 24. As will be discussed in more detail below, the graph-traversal processor 24 may include dedicated top-down processor 26a and bottom-up processor 26b. The graph-traversal processor 24 may provide optimized pipeline architecture for top-down and bottom-up graph-traversal of the type described below, it is anticipated that the special-purpose graph-traversal processor 24 will be a special-purpose integrated circuit and in one embodiment may be implemented using a field programmable gate array (FPGA) executing a firmware program.

The graph-traversal processor 24 may also communicate with a memory hierarchy 28 including on-chip memory 30, for example, being constructed on the same integrated circuit substrate as the processors 26, with high-bandwidth, off-chip memory 31 and with disk storage 20 either directly or through general-purpose processor 12.

In one embodiment, the high-bandwidth, off-chip memory 31 may be a Hybrid Memory Cube (HMC) memory constructed according to the specifications of the Hybrid Memory Cube Consortium being a joint collaboration between Micron and Samsung working with a variety of other manufacturers with components commercially available from Micron under the tradename HMC Gen2 (HMC-15 G-SR). This device generally provides extremely high bandwidth (amount of data transfer per second) providing two links (memory channels) of fill duplex communication each consisting of eight, fifteen gigabits per second lanes and providing a total bandwidth of thirty gigabytes per second. Other HMC components can support up to four links, each with sixteen, thirty gigabits per second lanes, and an aggregated bandwidth of 240 gigabytes per second. The general-purpose processor 12 may communicate with the on-chip memory 30 and off-chip memory 31 to load data into these memories related to a description of the graph to be traversed, as will be discussed below, and to read data out of the memories related to the results of graph-traversal.

The on-chip memory 30 may hold data structures used for the graph-traversal including a "visited" bitmap 32. The visited bitmap 32 (of which only a portion maybe held in on-chip memory 30) provides an array of bits equal in number to the vertices of the graph being traversed which may be set or reset to indicate whether those vertices have been visited.

The on-chip memory 30 may also include a frontier bitmap 33 (again, of which only a portion may be held in on-chip memory 30) describing a subset of the visited vertices of the graph describing a frontier of vertices that may connect to other unvisited vertices. Typically, vertices whose edges have all been explored are removed from the frontier bitmap 33 during the top-down traversal.

The on-chip memory 30 may also holds a portion of an adjacency list 34 describing, for each vertex, edges that connect to other vertices. The adjacency list 34 will be discussed in more detail below.

Because the on-chip memory 30 cannot hold the entirety of the visited bitmap 32, frontier bitmap 33 or adjacency list 34, on-chip portions of the structures are supplemented by corresponding visited bitmap 32', frontier bitmap 33', and adjacency list 34' in off-chip memory 31.

Referring still to FIG. 1, the graph-traversal processor 24 may include a processor controller 36 that may activate, alternatively, one or the other of the top-down processor 26a and bottom-up processor 26b during the graph-traversal. Typically, the graph traversal starts from a particular graph vertex using the top-down processor 26a, later switching to the bottom-up processor 26b, and then often switching back to the top-down processor 26a completing the final steps of the graph-traversal process.

The processor controller 36 is controlled by a threshold comparator 38 which analyzes the values of counters 40 and counter 42 communicating, respectively, with the top-down processor 26a and bottom-up processor 26b to collect statistics on the graph-traversal as will be discussed below.

Generally, each of the top-down processor 26a and bottom-up processor 26b may communicate with the on-chip memory 30 and off-chip memory 31 either directly as indicated by arrows 44 or through a decompressor 46 whose operation will be discussed in greater detail below. These decompressors 46 are shown separately but may in fact share components.

Figure 2:
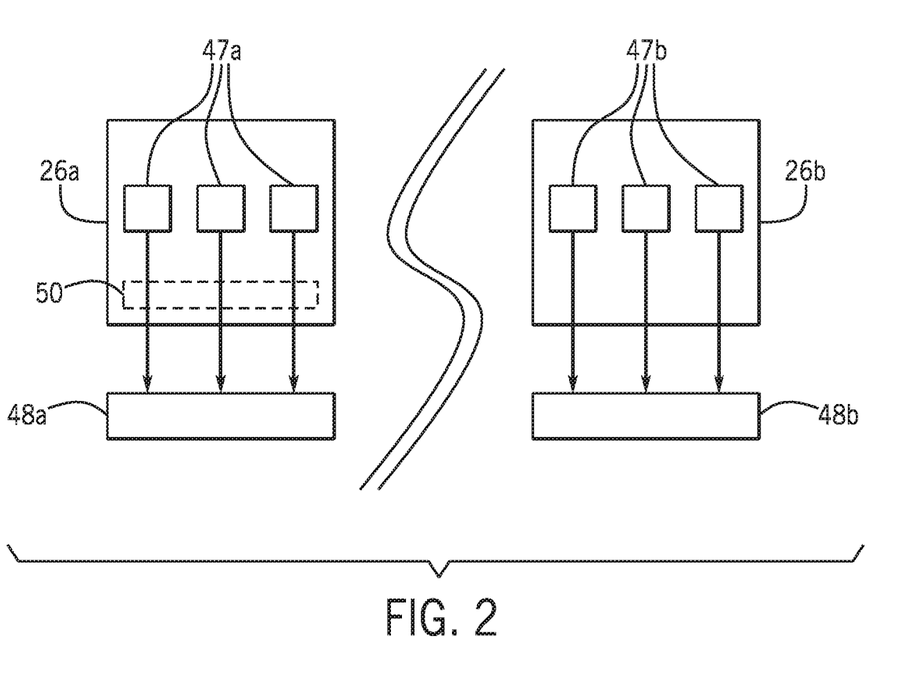
FIG. 2 is an expanded diagram of the top-down and bottom-up processor having multiple parallel processing elements communicating atomically with a pipeline for the top-down processor and non-atomically with a pipeline for the bottom-up processor.

Referring now to FIG. 2 each of the top-down processor 26a and bottom-up processor 26b may include multiple independently operating processing units 47a and 47b that may work in parallel on shared data in respective pipelines 48a and 48 to process different vertices of the graph at the same time for high-speed operation. Generally, the processing units 47a will write atomically to the pipeline 48a so as to prevent race conditions with respect to identifying vertices as visited. This atomic writing may be implemented by a lockout system 50 of a type known in the art. In contrast, the processing units 47b implementing the bottom-up processor 26b need not be atomically locked as will be discussed below.

Hardware Operation

Figure 5:
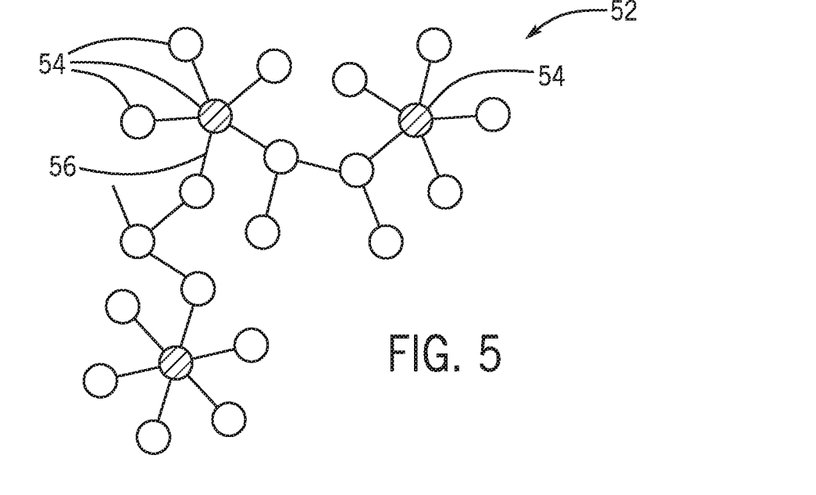
FIG. 5 is a simplified diagram of a scale-free network.
Figure 6:
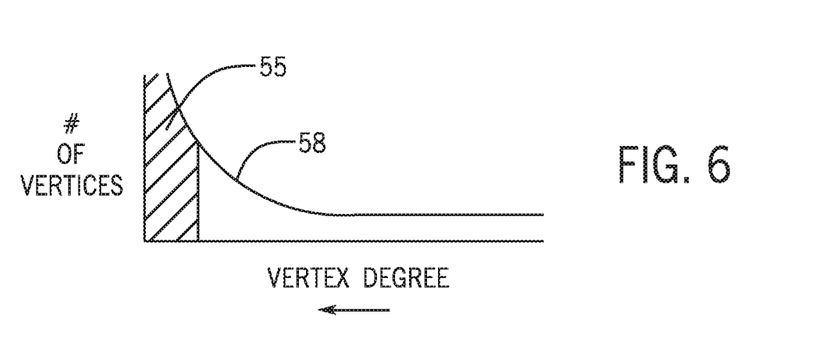
FIG. 6 is a graph showing the power law distribution of scale degree of the network of FIG. 5 accommodated by the present invention.

Referring now momentarily to FIGS. 5 and 6, a simplified graph 52 that may be traversed by the present invention may provide for a set of vertices 54 interconnected by edges 56. Generally, the graph 52 may be described by an adjacency list 34 that lists each vertex 54 by a unique vertex index and describes its direct connections with other vertices. Each vertex may also include additional information that may be accessed during the graph-traversal through a separate indexing operation not discussed herein.

During a graph-traversal, a starting vertex 54 is selected and the graph edges 56 are followed until every vertex in the graph has been visited. During the traversal, data related to the vertices 54 or their connections may be collected. Graph-traversal is a foundational operation for the processing of graphs 52 and can be used, for example, to develop simplified depictions of the graph (e.g., minimum spanning trees) sorting or identifying connections, for example, in social networks.

In many important graph applications, the graph 52 will approximate a so-called scale-free graph in which a small number of vertices 54 (shown here in crosshatching) have a high number of edges 56, much larger than the majority of the remaining vertices 54. The number of edges 56 will be referred to as vertex "degree," and in a scale-free graph, the number of edges in the set of vertices 54 of the graph 52 is generally a power law distribution 58. As will be discussed below, the present invention uses vertex degree to control the order of vertex traversal in the bottom-up traversal to improve the efficiency of the traversal and further uses vertex degree to locate vertex data (primarily adjacency list 34) within the memory hierarchy and to compress that data.

Figure 3:
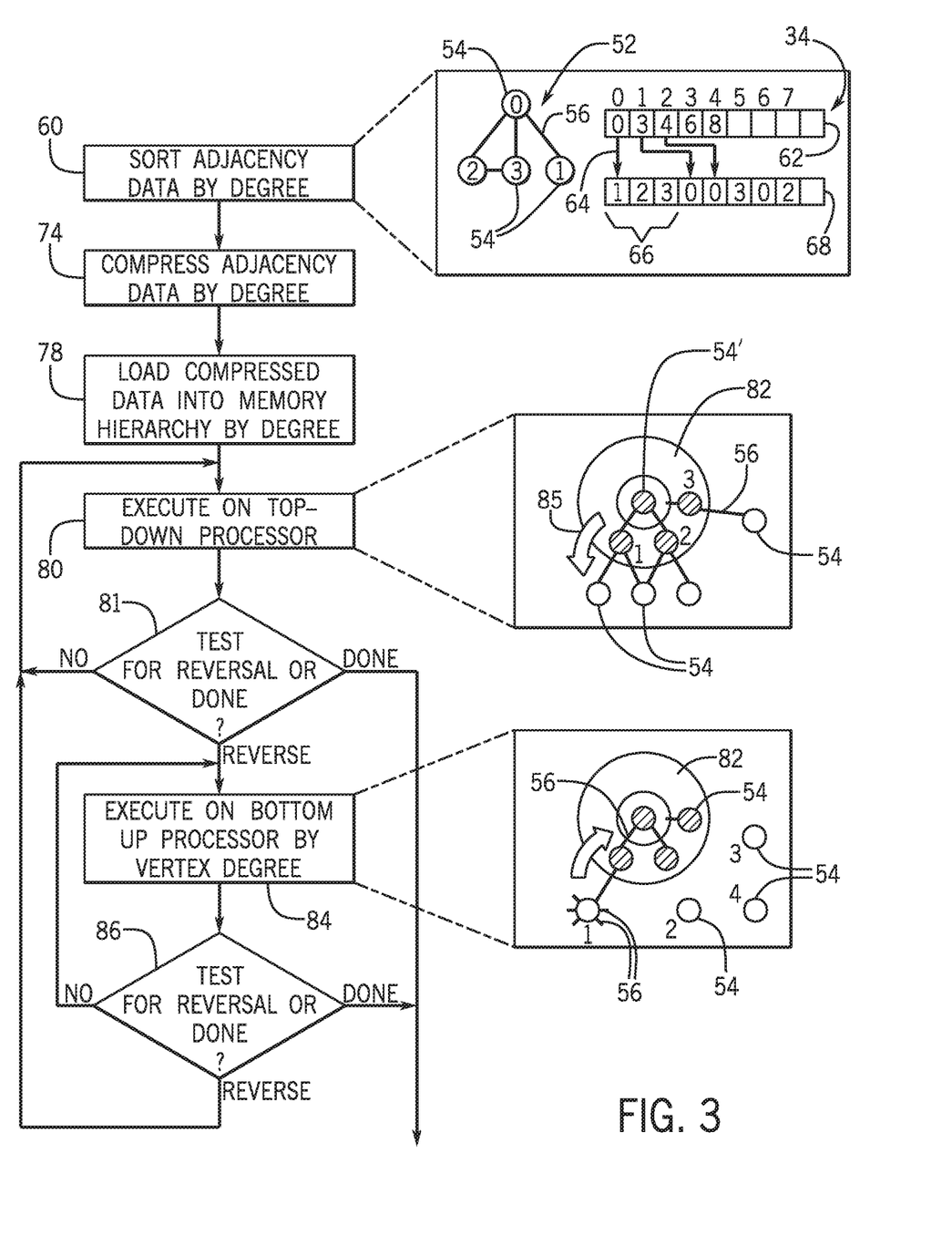
FIG. 3 is a block diagram of operation of the processor system of FIG. 1 including an off-line portion sorting graph vertex information and an online portion performing the traversal, FIG. 3 further including diagrams showing graph representation and top-down and bottom-up graph-traversal.

Referring now to FIGS. 1 and 3, a graph-traversal execution may begin as indicated by process block 60 with the sorting of the adjacency list 34 according to vertex degree so that the vertices 54 associated with highest degrees are positioned, for example, at the beginning of the adjacency list 34. A typical adjacency list 34 may, for example, provide a vertex index list 62 having one array element in an array for each vertex index (here showing vertices 0-7) where the vertex index is a unique number associated with each vertex 54 typically encoded in the address of the array elements. The value in the array elements for each vertex 54 provides a pointer 64 from a parent vertex 54 of the vertex index list 62 to the beginning of a range 66 in a corresponding adjacency array 68. The values in the adjacency array 68 within the range 66 of that parent vertex 54 describe each of the edges leading from the parent vertex 54 in terms of the index numbers of the vertices 54 connected to that parent vertex 54 by those edges. The end of the range 66 is described by the beginning of the next range of the next parent vertex 54 in the vertex index list 62.

The degree of a given vertex 54 is readily determined from the adjacency list 34 by the length of the range 66. Thus, referring to FIG. 3, vertex (0) has a degree of (3) indicating that the parent vertex (0) connects to three other vertices 54. Normally the vertices 54 will be arranged in the vertex index list 62 and the adjacency list 34 in an arbitrary order with respect to their degree, but they are sorted, for example, using a general-purpose processor 12, into an order according to degree so that the highest degree vertices 54 are first in these data structures. Preferably, the sorting can be strictly according to vertex degree; however, it will be appreciated from the following description that the invention works with lesser benefit if this sorting is observed generally, for example, through the ordered categories of high-, medium-, and low-vertex degree or statistically trending arrangements of vertex degree.

In the depicted example, the illustrated unsorted adjacency list 34 would be sorted by degree so that vertex (0) is first (having a degree of 3) followed by vertex (2) and (3), both having a degree of 2, finally followed by vertex (1) having a degree of 1. In this sorting process, the order of the vertices in the vertex index list 62 will be changed correspondingly and a mapping table 23 (shown in FIG. 1) may be developed by the general-purpose processor 12 to map this new order to the original vertex numbering so that the original vertex ordering can be reestablished. The values held in each array element of the adjacency array 68 may be updated to refer to the new index values of the sorted vertex index lists 62. Generally, the visited bitmap 32 and frontier bitmap 33 may be similarly sorted to promote localization of this data for efficient access.

Figure 4:
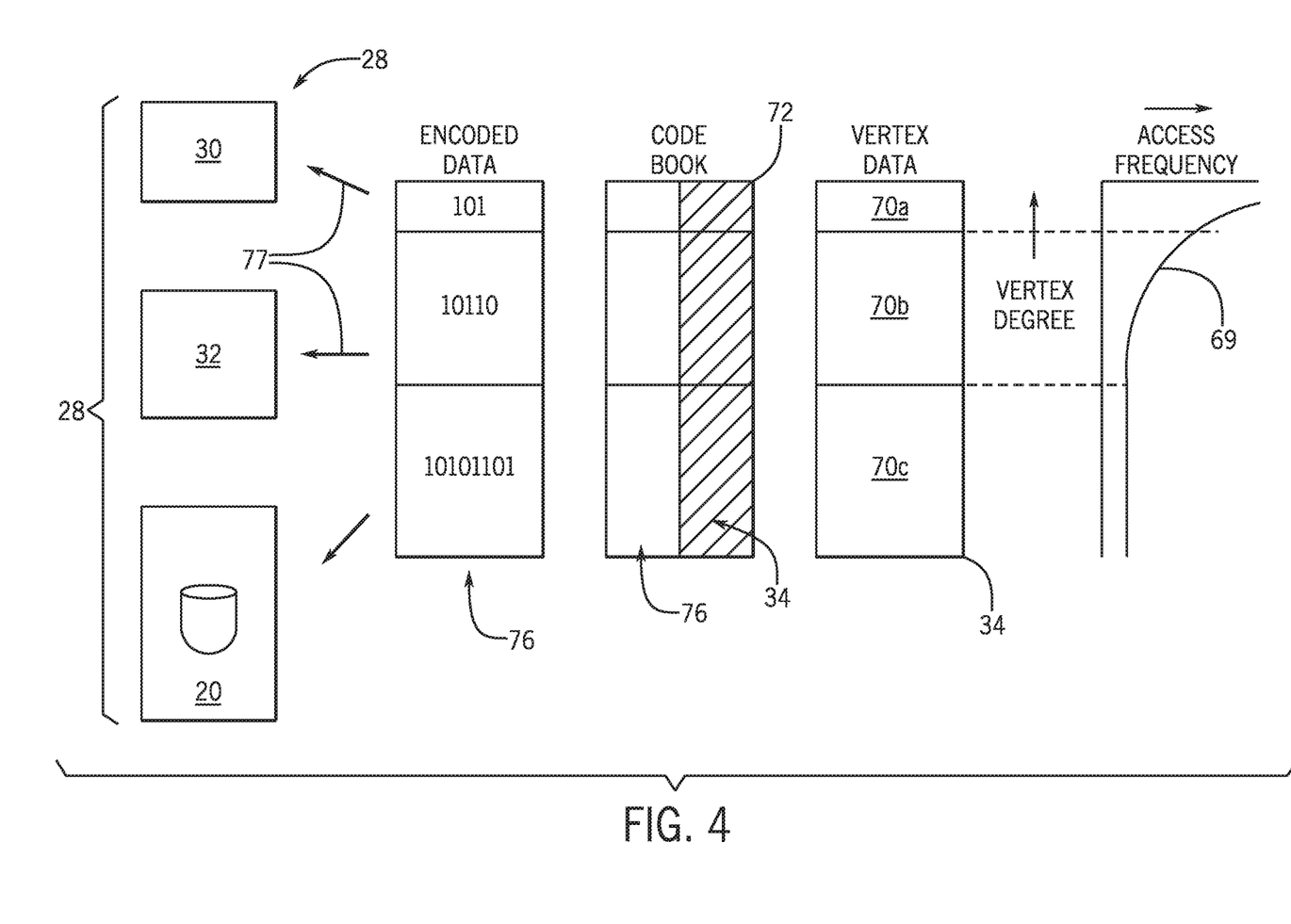
FIG. 4 is a dataflow diagram showing the translation of sorted vertex data through a codebook and allocated between various memory systems of the memory hierarchy.

Referring now to FIG. 4, the present inventors have determined that vertices of higher degree statistically experience larger numbers of memory accesses in a graph-traversal than vertices 54 of lesser degree as indicated by depicted asymptotically declining curve 69. Accordingly, vertex data of the adjacency list 34 as sorted may be divided into bins 70*a-c* associated with different memory structures of the memory hierarchy 28 (shown in FIG. 1). Generally, the size of the bins 70*a-c* will be equal to the size of the different memory structures in the memory hierarchy 28, with, for example, the first bin 70*a* holding data of the adjacency list 34 associated with vertices 54 having the highest vertex degree that will match the size of and be associated with on-chip memory 30. Similarly, the size of bin 70*b* holding data of the adjacency list 34 associated with vertices 54 having a lower vertex degree will match the size of off-chip memory 31, and finally bin 70*c* will hold data of the adjacency list 34 associated with the long-tail of vertices 54 having lowest vertex degree and will have a size sufficient to be stored and will be stored in disk storage 20. In this way, the most frequent memory accesses of data of vertices 54 having a higher vertex degree will be held in the faster memory structures providing improved access speed.

This allocation of data of the vertices 54, for example, from the adjacency list 34 to the memory hierarchy 28 may be done directly, or alternatively this data may first be compressed using code table 72 to produce encoded codewords 76 which are then allocated to the memory hierarchy 28 per arrows 77. In this process, the vertex data of the bins 70*a-c* may be subject to different compression regimes providing greater compression of data in the bin 70*a* to permit greater storage in the small storage regions of the on-chip memory 30. Similarly, the data in the bin 70*b* may be subject to greater compression than the data in the bin 70*c* to permit thrifty use of off chip memory 31. This variation in net compression may be performed by assigning shorter codewords 76 (of a range of codewords) to the more frequently accessed data through proper construction of the codebook 72 mapping the adjacency list 34 to codewords 76. Generally, the length of the codewords 76 is set to be shorter for vertex data of vertices of higher degree. This coding process may make use of a variety of different known compression techniques including Huffman encoding. In one embodiment, the coding process may be Exp-Golomb encoding, for example, described at Solomon Golomb, Run-length encodings (Corresp.), IEEE Transactions on Information Theory 12, 3 (1966), 399-401.

Referring again to FIG. 3, this compression process shown by process block 74 and the loading of the codewords into memory is indicated process block 78. These steps may be performed "off-line" with respect to the processor 24 or may be performed by dedicated hardware incorporated into the processor 24 as mentioned below.

Once the vertex data is properly sorted, compressed, and loaded into the processor 24, the processor 24 may be activated in particular with the processor controller 36 by enabling the top-down processor 26*a* (shown in FIG. 1) as indicated by process block 80. In this process, starting at a seed vertex 54' designated in configuration data for the processor 24 by a user, the processor 24 will interrogate the adjacency list 34 and identify those vertices 54 connected to each of the edges of the seed vertex 54' to define a frontier 82. The processor 24 will then move through the vertices 54 of the frontier in sequence (for example, shown by the numbers 1, 2, and 3) to identify further vertices 54 connected to the vertices 54 of the frontier 82 thereby establishing a new frontier (not shown) in an outward expansion of the frontier 82 indicated by arrow 85. During this process, the bit arrays of the visited bitmap 32 (shown in FIG. 1) keep track of those vertices 54 have been visited, and the frontier bitmap 33 keeps track of those vertices within the frontier 82 and are updated accordingly. Generally, vertices 54 that have had all edges investigated may be removed from the frontier bitmap 33 but remain visited and thus remain in visited bitmap 32.

A simplified algorithm for a top-down traversal follows the following steps:

```
for each frontier of vertices;
    for each vertex in the frontier;
        if an edge-connected vertex not been visited;
            mark the vertex as visited;
            move the marked vertex to the frontier and collect other data;
        next edge;
    next vertex;
next frontier.
```

It will be appreciated that multiple processing units 47 of the top-down processor 26a may operate in parallel to investigate different vertices 54 of the frontier 82 but that when they find an un-visited vertex 54 they must atomically mark it as read so there are not multiple processing units 47 writing to a given "child" vertex. Access of the necessary data for this traversal may be obtained using pipeline techniques communicating with the memory hierarchy 28 (shown in FIG. 1).

As the frontier 82 expands, the efficiency of the search process is reduced because of the increasing likelihood that multiple given vertices 54 in the frontier 82 will connect to a common vertex, for example, vertex 54". In those cases, subsequent checking of other edges 56 to the common vertex 54" will be a waste of processor resources entailing unnecessary access to the adjacency list 34 in memory hierarchy 28 for that edge and unnecessary consumption of processor power.

To address this decreased efficiency caused by redundancy of edge checking, after each frontier 82 is complete (all of the contained vertices 54 have been scanned) as indicated by decision block 88, a decision may be made as to whether it is more efficient to begin a bottom-up processing using bottom-up processor 26b.

This decision as to whether to begin bottom-up processing, indicated by decision block 81, looks at counters 40 and 42 which may be updated concurrently. Counter 40 keeps track of the number of edges that need to be checked in the current frontier ($m_f$) and the number of unexplored edges ($m_u$) while counter 42 keeps track of the size of the frontier in vertices ($n_f$). These counters 40 and 42 may be updated during the traversal process in hardware eliminating the need to scan through the frontier bitmap 33 or the adjacency list 34.

Specifically, ($m_f$) and ($n_f$) are calculated by accumulating the degrees and numbers of each vertex 54 as that vertex 54 is added to the frontier 82. The remaining value, $m_u$, is calculated by subtracting the sum of all degrees of all visited vertices from the total number of edges.

The threshold determination as to when to switch between top-down or bottom-up processing, indicated by decision block 81, may employ the technique described in the above-referenced Beamer paper as incorporated by reference. Preliminary experimentation has suggested that the thresholds of $\alpha=15$ and $\beta=20$ may be used. In this process, threshold comparator 38 reviews the counters 40 and 42 and controls the top-down processor 26a (in this case deactivating it) and the bottom-up processor 26b (in this case activating it). The same decision block 81 may also check at the conclusion of each frontier 82 to see whether all vertices 54 have been visited and if so the program terminates.

Assuming that the traversal is not complete, if the decision at decision block 81 is to no longer use top-down processing, bottom-up processing using bottom-up processor 26b (shown in FIG. 1) is begun as indicated by process block 84. In bottom-up processing, the sequencing through the vertices 54 of the frontier 82 is no longer performed and the processing instead sequences through unvisited vertices 54 in an order according to vertex degree facilitated by the sorting of the adjacency list 34. That is, the bottom-up processor 26b starts with unvisited vertices of the highest degree.

At each unvisited vertex 54, the edges are examined to see if they connect to the frontier 82 (that is, if they connect to a vertex 54 already in the frontier 82). If such a connection exists, the unvisited vertex 54 is marked as visited and no further edges of that vertex 54 need to be reviewed. This ability to shortcut the review of edges is a significant benefit to the bottom-up approach.

A simplified algorithm for a bottom traversal follows the following steps:

```
for each unvisited vertex;
    for each edge;
        if the edge connects to a vertex in the frontier;
            mark unvisited vertex as visited;
            add vertex to frontier
            break;
        next edge;
    next vertex;
```

The frontier 82 in this case continues to grow without removal of vertices 54 because added vertices 54 do not have all other edges explored such as would permit them to be removed from the frontier 82, it will be appreciated that review of the unvisited vertices 54 may be performed in parallel by processing units 47b and no atomic writing by the processing units 47b of the bitmaps associated with the unvisited arrays are necessary because no other processing units 47b will be dealing with that unvisited vertex 54. Once each unvisited vertex 54 has been visited, there will remain some vertices 54 that are still not connected to the frontier 82 (and thus marked as visited). This process will then loop through the unvisited vertices 54 again with the expectation that some of these unvisited vertices will now connect to the frontier 82 as the frontier 82 has expanded.

Figure 7:
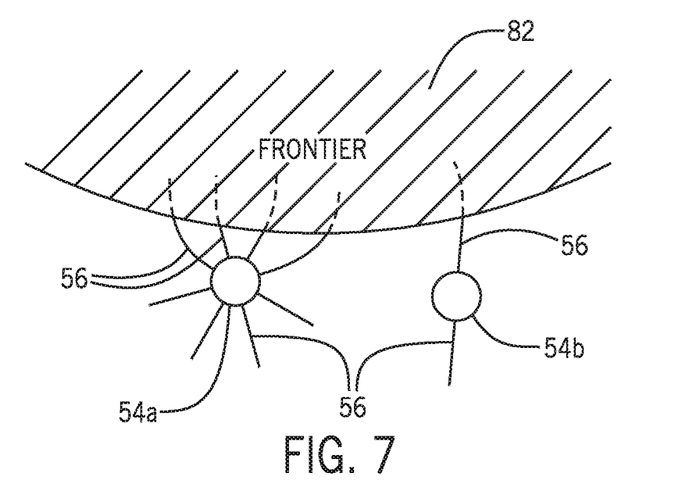
FIG. 7 is a diagram of a high-degree and low-degree vertex during a bottom-up connection of vertices to a frontier providing an intuitive framework for the speed gains of the present invention.

Referring momentarily to FIG. 7, an intuitive understanding of the benefit of a bottom-up traversal using degrees-sorted vertices 54 may be obtained by considering a high-degree vertex 54a and a low-degree vertex 54b, each having half of their edges connected to the frontier 82. Visiting either of the vertices 54a and 54b presents an equal chance of any given edge 56 connecting to the frontier 82 and terminating the review of those edges. In that regard these two vertices 54a and 54b are equally attractive as far as avoiding the probability of quickly obtaining the "break" state terminating review of that vertex. However, the high-degree vertex 54a, when added to the frontier 82, greatly increases the rate at which other vertices 54 will connect to the frontier 82 because it presents a larger number of frontier-unconnected edges presenting more opportunities for the remaining vertices than the low-degree vertex 54b. As a result, by starting with high-degree vertices 54a, the unconnected edges of the frontier 82 increase more rapidly increasing the chance of future vertices quickly terminating compared to the reverse order. This in turn reduces the need to repeatedly loop through the unvisited vertices.

Referring again to FIG. 3, as noted above, after each of the unvisited vertices 54 has been reviewed there will be some unvisited vertices that have not connected to the current frontier, and this bottom-up sequencing will be repeated after passing through decision block 86 which again tests for whether the traversal is complete and for whether it is desirable to resume top-down processing per process block 80. Again, decision block 86 relies on an evaluation of 40 and 42 by the threshold comparator 38 and activation of the processors 26 by processor controller 36.

Assuming that graph traversal is not complete, the processing of the graph 52 continues moving between processing by process blocks 80 and 84 according to the values of counters 40 and 42 compared by threshold comparator 38.

While the above discussion considers performance of process blocks 60, 74 and 78 as being done offline by a separate general-purpose processor 12, it will be appreciated that these steps may also be incorporated into the processor 24 by providing dedicated sorting and compression circuitry that performs an initial scan through the necessary adjacency list 34 to provide the sorting and compression described above.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s) and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

What we claim is:

1. A computer architecture for traversal of a graph comprising:
    a memory holding an adjacency list describing vertices of the graph and connections through edges to other vertices from each of the vertices; and
    a processor communicating with the memory and operating in a bottom-up mode from unvisited vertices toward a frontier of visited vertices, by accessing the adjacency list from the memory to examine the unvisited vertices to find connections to any visited vertex of the frontier using the accessed adjacency list and moving to a next unvisited vertex when a connection to a visited vertex of the frontier is found;
    wherein the unvisited vertices in the bottom-up mode are are examined and traversed in an order of vertex degree being a number of edges connecting to each unvisited vertex; and
    wherein the adjacency list indicates relative vertex degree of the vertices permitting unproductive edge checks to be produced by examining the vertices according to the relative vertex degree.

2. The computer architecture of claim 1, wherein the adjacency list is arranged in the memory by vertex degree.

3. The computer architecture of claim 1, wherein the memory decompressor employs a decompression of Exp-Golomb coding.

4. The computer architecture of claim 1, further including a sorting processor executing a stored program and receiving an unsorted adjacency list describing unsorted vertices of the graph and connections through edges to other vertices of each unsorted vertex and sorting that unsorted adjacency list according to the order of vertex degree.

5. The computer architecture of claim 4, wherein the sorting processor generates a mapping table indicating a mapping from the unsorted vertices of the unsorted adjacency list to the vertices of the adjacency list.

6. A computer architecture for traversal of a graph comprising:
    a memory holding an adjacency list describing vertices of the graph and connections through edges to other vertices from each of the vertices; and
    a processor communicating with the memory and operating in a bottom-up mode from unvisited vertices toward a frontier of visited vertices, by accessing the adjacency list from the memory and examining the unvisited vertices to find connections to any visited vertex of the frontier using the accessed adjacency list and traversing to a next unvisited vertex when a connection to a visited vertex of the frontier is found;
    wherein the unvisited vertices in the bottom-up mode are examined and traversed in an order of vertex degree being a number of edges connecting to each unvisited vertex;
    wherein the adjacency list is arranged in the memory by the order of vertex degree;
    wherein the memory provides a memory hierarchy beginning with smaller, high-access speed memory circuits and progressing to larger, low-access speed memory circuits;
    wherein the adjacency list is organized to place descriptions of vertices of the adjacency list having a higher vertex degree toward the beginning of the memory hierarchy relative to descriptions of vertices of the adjacency list having a lower vertex degree; and wherein the arrangement of the adjacency list reduces memory access time for the vertices with the higher vertex degree expected to have larger number of memory accesses compared to the vertices with the lower vertex degree.

7. The computer architecture of claim 6, wherein the memory hierarchy includes on-chip memory on a same integrated circuit as the processor and off-chip hybrid memory cube memory.

8. A computer architecture for traversal of a graph comprising:
a memory holding an adjacency list describing vertices of the graph and connections through edges to other vertices from each of the vertices; and
a processor communicating with the memory system and operating in a bottom-up mode from unvisited vertices toward a frontier of visited vertices, by accessing the adjacency list from the memory and examining the unvisited vertices to find connections to any visited vertex of the frontier using accessed the adjacency list and traversing to a next unvisited vertex when a connection to a visited vertex of the frontier is found;
wherein the unvisited vertices in the bottom-up mode are examined and traversed in an order of vertex degree being a number of edges connecting to each unvisited vertex;
wherein the adjacency list is arranged in the memory by the order of vertex degree; and
a decompressor circuit positioned between the processor and the memory decompressing the adjacency list according to a codebook translating codewords into the adjacency list and wherein smaller codewords are associated with data of the adjacency list for vertices of a higher vertex degree, and
wherein the association of the smaller codewords for the vertices of the higher expected to have larger numbers of memory accesses compared to vertices with a lower vertex degree.

9. The computer architecture of claim 8, wherein the memory decompressor employs a decompression of Ex-Golomb coding.

10. A computer architecture for traversal of a graph comprising:
a memory holding an adjacency list describing vertices of the graph and connections through edges to other vertices from each of the vertices; and
a processor communicating with the memory and operating in a bottom-up mode from unvisited vertices toward a frontier of visited vertices, by accessing the adjacency list from the memory and examining the unvisited vertices to find connections to any visited vertex of the frontier using the accessed adjacency list and traversing to a next unvisited vertex when a connection to a visited vertex of the frontier is found;
wherein the unvisited vertices in the bottom-up mode are examined and traversed in order of a vertex degree being a number of edges connecting to each unvisited vertex;
wherein the adjacency list is arranged in the memory by the order of vertex degree;
wherein the processor further operates in a top-down mode from the frontier to the unvisited vertices by examining edges of the visited vertices of the frontier to find connections to the unvisited vertices using the adjacency list;
wherein the computer architecture further comprises a mode switch switching between the top-down mode and the bottom-up mode according to parameters describing progress of the traversal through the graph; and
wherein the adjacency list indicates relative vertex degree of the vertices permitting unproductive edge checks to be produced by examining the vertices according to the relative vertex degree.

11. The computer architecture of claim 10, further including counters updated by the processor during the traversal of the graph and wherein the mode switch reads the counters to switch between the top-down and bottom-up modes based on values of the counters.

12. The computer architecture of claim 11, wherein the counters indicate a size of the frontier.

13. The computer architecture of claim 10, wherein the processor provides a separate processing circuitry for each of the top-down and bottom-up modes.

14. The computer architecture of claim 13, wherein the separate processing circuitry employs multiple parallel processors.

15. The computer architecture of claim 14, wherein the memory hierarchy includes on-chip memory on a same integrated circuit as the processor and off-chip hybrid memory cube memory.

16. The computer architecture of claim 13, wherein the separate processing circuitry has independent pipelines.

17. The computer architecture of claim 10, wherein the processor is a field-programmable gate array (FPGA).

18. The computer architecture of claim 1, wherein the adjacency list is arranged in the memory by the order of vertex degree.

19. The computer architecture of claim 10, wherein the memory provides a memory hierarchy beginning with smaller, high-access speed memory circuits and progressing to larger, low-access speed memory circuits and wherein the adjacency list is organized to place descriptions of vertices of the adjacency list having a higher vertex degree toward the beginning of the memory hierarchy relative to descriptions of vertices of the adjacency list having a lower vertex degree.

20. The computer architecture of claim 10, further including a decompressor circuit positioned between the processor and the memory decompressing the adjacency list according to a codebook translating codewords into the adjacency list and wherein smaller codewords are associated with data of the adjacency list for vertices of a higher vertex degree.

* * * * *